(12) United States Patent
Sanzaro et al.

(10) Patent No.: US 12,235,155 B2
(45) Date of Patent: Feb. 25, 2025

(54) PHOTON DETECTION SYSTEM INCLUDING AN AVALANCHE PHOTODIODE AND A BIASING CIRCUIT TO SUPPLY A GATING SIGNAL

(71) Applicant: Kabushiki Kaisha Toshiba, Tokyo (JP)

(72) Inventors: Mirko Sanzaro, Cambridge (GB); Christopher Meayers, Cambridge (GB); James F. Dynes, Cambridge (GB); Andrew Simpkins, Cambridge (GB); Andrew James Shields, Cambridge (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 18/175,618

(22) Filed: Feb. 28, 2023

(65) Prior Publication Data

US 2024/0085240 A1 Mar. 14, 2024

(30) Foreign Application Priority Data

Sep. 8, 2022 (GB) ...................................... 2213116

(51) Int. Cl.
*G01J 1/44* (2006.01)
(52) U.S. Cl.
CPC ......... *G01J 1/44* (2013.01); *G01J 2001/4466* (2013.01)
(58) Field of Classification Search
CPC ..... G01J 2001/44; H01L 31/02; H01L 31/107
(Continued)

(56) References Cited

U.S. PATENT DOCUMENTS

| | | | |
|---|---|---|---|
| 5,721,424 A | * | 2/1998 | Price ................. H01L 31/02027 250/214 R |
| 6,218,657 B1 | | 4/2001 | Bethune et al. |

(Continued)

FOREIGN PATENT DOCUMENTS

| | | |
|---|---|---|
| CN | 101650228 A | 2/2010 |
| CN | 201503314 U | 6/2010 |

(Continued)

OTHER PUBLICATIONS

Dalla Mora, A. et al. "Fast-Gated Single-Photon Avalanche Diode for Wide Dynamic Range Near Infrared Spectroscopy," in IEEE Journal of Selected Topics in Quantum Electronics, vol. 16, No. 4, pp. 1023-1030, Jul.-Aug. 2010, doi: 10.1109/JSTQE.2009.2035823. (8 pages).

(Continued)

*Primary Examiner* — Thanh Luu
(74) *Attorney, Agent, or Firm* — Oblon, McClelland, Maier & Neustadt, L.L.P.

(57) ABSTRACT

A photon detection system comprising an avalanche photodiode configured to generate a photodiode signal in response to an incident photon. The photon detection system also comprises a biasing circuit configured to supply a gating signal to the avalanche photodiode. The gating signal is a periodic signal configured to reverse bias the avalanche photodiode above and below its breakdown voltage for photon detection during each period. The photon detection system further comprises a non-reflective filter circuit configured to receive, at an input port, the photodiode signal, and provide, at a first output port, a first filtered output signal by applying a low-pass filter with a first cut-off frequency to the received photodiode signal.

20 Claims, 6 Drawing Sheets

(58) Field of Classification Search
USPC .................................. 250/214 R, 214.1, 226
See application file for complete search history.

(56) References Cited

U.S. PATENT DOCUMENTS

| | | | |
|---|---|---|---|
| 7,705,284 | B2 | 4/2010 | Inoue et al. |
| 8,796,605 | B2 | 8/2014 | Mordarski et al. |
| 9,377,356 | B2 | 6/2016 | Yuan et al. |
| 9,401,448 | B2 | 7/2016 | Bienfang et al. |
| 11,158,663 | B2 * | 10/2021 | Cao .................. H01L 27/14643 |
| 2012/0177201 | A1 * | 7/2012 | Ayling .................. H04L 9/0858 380/278 |
| 2014/0027607 | A1 * | 1/2014 | Mordarski ................ G01J 1/44 250/206 |
| 2016/0091617 | A1 * | 3/2016 | Bouzid .................. G01T 1/244 250/371 |

FOREIGN PATENT DOCUMENTS

| | | |
|---|---|---|
| CN | 104 218 917 A | 12/2014 |
| CN | 107024289 A | 8/2017 |
| CN | 107 356 855 A | 11/2017 |
| CN | 207066607 U | 3/2018 |
| EP | 2 333 843 A1 | 6/2011 |
| JP | 2003-142724 A | 5/2003 |
| JP | 2003-243694 A | 8/2003 |
| JP | 2005-114712 A | 4/2005 |
| JP | 2006-510247 A | 3/2006 |
| WO | WO 2007/102430 A1 | 9/2007 |
| WO | WO 2008/012865 A1 | 1/2008 |

OTHER PUBLICATIONS

Campbell, J. et al. "Common-Mode Cancellation in Sinusoidal Gating With Balanced InGaAs/InP Single Photon Avalanche Diodes," in IEEE Journal of Quantum Electronics, vol. 48, No. 12, pp. 1505-1511, Dec. 2012, doi: 10.1109/JQE.2012.2223200. (7 pages).

Scarcella, C. et al. "InGaAs/InP Single-Photon Detector Gated at 1.3 GHz With 1.5% Afterpulsing," in IEEE Journal of Selected Topics in Quantum Electronics, vol. 21, No. 3, pp. 17-22, May-Jun. 2015, Art No. 3800306, doi: 10.1109/JSTQE.2014.2361790. (8 pages).

Tomita, A. et al. "A Balanced gated-mode photon detector for quantum-bit discrimination at 1550 nm," Opt. Lett., vol. 27, No. 20, pp. 1827-1829, Oct. 2002. (5 pages).

Search Report issued Aug. 18, 2023, in European Patent Application No. EP 23 15 8256.0, citing document Nos. 15, 16, and 24.

Gebremicael, et al., "Capacitive Response Signal Cancellation for Sine Wave Gated High-Speed Single Photon Avalanche Photodiode Detector", IEEE Journal of Quantum Electronics, IEEE, USA, vol. 57, No. 4, May 10, 2021, pp. 1-5.

Japanese Office Action issued Jan. 30, 2024 in Japanese Patent Application No. 2023-023739 (with English translation), 10 pages.

* cited by examiner

PHOTON DETECTION SYSTEM INCLUDING AN AVALANCHE PHOTODIODE AND A BIASING CIRCUIT TO SUPPLY A GATING SIGNAL

CROSS REFERENCE

This application claims priority from UK application number 2213116.3, the contents of which are herein incorporated by reference.

FIELD

Embodiments described herein relate to photon detection systems and methods.

BACKGROUND

Single-photon detectors are used in applications such as time of flight ranging, medical imaging and quantum communication to detect weak optical pulses at the level of single photons. Single-Photon Avalanche Diodes (SPADs) are a type of single-photon detectors that is commonly employed for high speed single-photon detection in the visible and near-infrared (NIR) optical range.

InGaAs/InP SPADs are used for photon detection at telecommunication wavelengths. To reduce the likelihood of dark counts and afterpulses, InGaAs/InP SPADs are usually operated in a gated mode. A periodic bias signal, commonly referred to as "gate", is applied to the SPAD to arm and quench the device during each period. Gated-mode operation typically improves the signal-to-noise ratio in applications with a pulsed light source synchronous with the gate signal, i.e. in applications in which the potential arrival times of photons are known.

SUMMARY

According to a first aspect of the present invention there is provided a photon detection system comprising an avalanche photodiode, a biasing circuit and a non-reflective filter circuit. The avalanche photodiode is configured to generate a photodiode signal in response to an incident photon. The biasing circuit is configured to supply a gating signal to the avalanche photodiode. The gating signal is a periodic signal configured to reverse bias the avalanche photodiode above and below its breakdown voltage for photon detection during each period. The non-reflective filter circuit is configured to receive, at an input port, the photodiode signal, and provide, at a first output port, a first filtered output signal by applying a low-pass filter with a first cut-off frequency to the received photodiode signal.

The gating signal may have a gate frequency which is higher than the first cut-off frequency. The non-reflective filter circuit may be further configured to provide, at a second output port, a second filtered output signal by applying a high-pass filter with a second cut-off frequency to the received photodiode signal. The first cut-off frequency and second cut-off frequency may be substantially the same.

The photon detection system may further comprise a power measuring circuit configured to determine a signal power based on the second filtered output signal. The biasing circuit may further be configured to receive a feedback signal generated based on the determined signal power, and to adjust, based on the feedback signal, the gating signal to match a target gating signal.

The non-reflective filter circuit may be a diplexer.

The photon detection system may further comprise a discriminator circuit configured to output an electrical pulse based on the first filtered output signal.

The gating signal may be in the form of square wave or a sinusoid. The gating signal may have a gate frequency which is greater than 1 GHz. The avalanche photodiode may be an InGaAs/InP single-photon avalanche photodiode.

According to a second aspect of the present invention there is provided a quantum communication system, comprising a sender configured to send light pulses encoded using a basis selected from at least two bases, and a receiver comprising the photon detection system.

According to a second aspect of the present invention there is provided a method of detecting a photon using an avalanche photodiode. The method comprises supplying a gating signal to the avalanche photodiode, wherein the gating signal is a periodic signal configured to reverse bias the avalanche photodiode above and below its breakdown voltage for photon detection during each period. The method further comprises providing, to a non-reflective filter circuit, a photodiode signal generated by the avalanche photodiode in response to an incident photon. The method further comprises providing, at a first output port of the non-reflective filter circuit, a first filtered output signal by applying a low-pass filter with a first cut-off frequency to the provided photodiode signal.

The method may further comprise providing, at a second output port of the non-reflective filter circuit, a second filtered output signal by applying a high-pass filter with a second cut-off frequency to the received photodiode signal.

The method may further comprise determining, by a power measuring circuit, a signal power based on the second filtered output signal.

The method may further comprise receiving a feedback signal generated based on the determined signal power, and adjusting, based on the feedback signal, the gating signal to match a target gating signal.

The method may further comprise determining the presence or absence of photon induced spikes in the first filtered output signal, and in response to determining the presence of photon induced spikes in the first filtered output signal, generating as an output an electrical signal.

DETAILED DESCRIPTION

Figure 1:
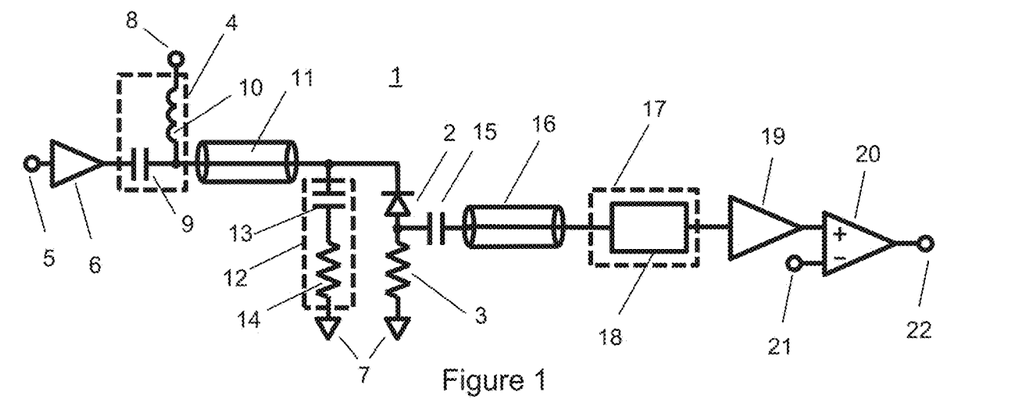
FIG. 1 is a schematic of a photon detection system.

FIG. 1 is a schematic of a photon detection system 1 which may be used for detection of incoming single photons. The photon detection system 1 comprises a single-photon avalanche diode (SPAD) 2 and a biasing circuit. When the SPAD 2 is biased above its breakdown voltage, a photon absorbed by the SPAD 2 generates an electron-hole pair, which can trigger an avalanche of excess carriers. This avalanche multiplication of excess carriers causes a macroscopic current flow through the SPAD 2. Electrical circuitry connected to the SPAD 2 detects the avalanche current and outputs a digital signal indicative of the detected photon.

Further referring to FIG. 1, the photon detection system 1 comprises a first input terminal 8 for receiving a DC input voltage, a second input terminal 5 for receiving an AC input voltage. The second input terminal 6 is connected to an amplifier 6 which is configured to amplify the received AC input voltage. The photon detection system 1 further comprises a bias-tee circuit 4 connected to the first input terminal 8 and an output of the amplifier 6. The bias-tee circuit 4 includes a capacitor 9 and an inductor 10, and is configured to combine the AC and DC input voltages to form a combined voltage on an output of the bias-tee circuit 4.

A cathode of the SPAD 2 is connected through a first transmission line 11 to the output of the bias-tee circuit 4 and configured to receive the combined voltage from the bias-tee circuit 4. Also connected to the cathode of the SPAD 2 is an AC-termination circuit 12 comprising a capacitor 13 and a resistor 14, and configured to reduce reflections caused by the combined voltage from the bias-tee circuit 4.

An anode of SPAD 2 is connected to ground 7 through a resistor 3. A first terminal of capacitor is connected between the anode of the SPAD 2 and the resistor 3. A second terminal of capacitor 15 is connected to an input port of a non-reflective filter circuit 17 through a second transmission line 16. The non-reflective filter circuit 17 comprises a low-pass filter 18 which is characterised by a cut-off frequency $f_{LP}$. The cut-off frequency $f_{LP}$ is lower than a gate repetition frequency $f_{gate}$.

The input port of non-reflective filter circuit 17 is impedance matched to the second transmission line 16 up to a frequency $f_{non-refl}$. In other words, the non-reflective filter circuit 17 is configured to prevent reflections back to the SPAD 2. The frequency $f_{non-refl}$ is higher than the gate repetition frequency $f_{gate}$, and may be higher than three times the gate repetition frequency $f_{gate}$. For signals at frequencies lower than frequency $f_{non-refl}$, a return loss of the non-reflective filter circuit 17 may be higher than 3 dB or, preferably, may be higher than 10 dB. Signals at frequencies below frequency $f_{non-refl}$ and above the cut-off frequency $f_{LP}$ may be absorbed by the non-reflective filter circuit 17.

An output of the non-reflective filter circuit 17 is connected to an amplifier 19. The amplifier 19 may be a low-noise amplifier. An output of the amplifier 19 is connected to a first input port of a discriminator 20. The discriminator 20 is configured such that an output signal of the amplifier 19 is discriminated against a predetermined voltage level applied to a second input port 21 of the discriminator 20. The discriminator 20 is further configured to output a digital signal, for example a TTL pulse, to feed a detector output 22.

During operation of the photon detection system 1, the SPAD 2 is reverse biased by a DC bias $V_{bias}$ applied between the first input terminal 8 and ground 7, and a gating signal $V_{gate}$ applied between the second input terminal 5 and ground 7.

Figure 2:
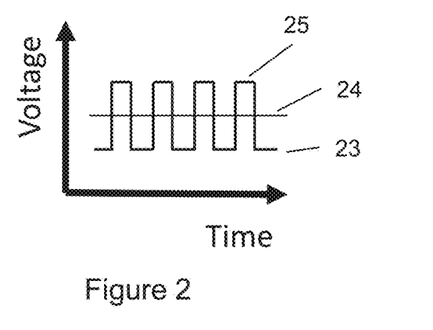
FIG. 2 is a schematic plot of voltage against time for a voltage applied to bias an SPAD of FIG. 1.

The gating signal $V_{gate}$ is a periodic voltage signal with the gate repetition frequency $f_{gate}$. The gate repetition frequency $f_{gate}$ may be 1 GHz or more. The gating signal $V_{gate}$ may be in the form of square wave with adjustable duty cycle, a sinusoid or an arbitrary periodic wave. The DC bias V bias is set either below, equal or higher than a breakdown voltage $V_b$ of the SPAD 2. In any case, the superimposed gating signal $V_{gate}$ then periodically biases the SPAD 2 above the breakdown voltage in order to make the SPAD 2 single photon sensitive for a predetermined amount of time. For example, FIG. 2 shows a square wave shaped gating signal 25 combined with the DC bias 23 periodically exceeding the breakdown voltage 24.

Figure 3:
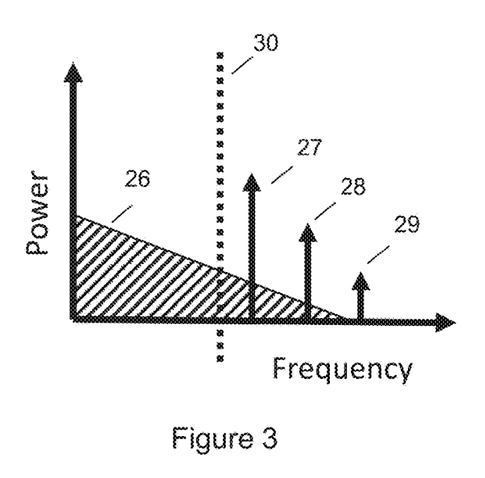
FIG. 3 is a schematic plot of power against frequency showing a power spectrum of electrical signals generated by the SPAD.

When the SPAD 2 is biased above its breakdown voltage, an absorbed photon generates an electron-hole pair in the SPAD 2, which upon separation can trigger an avalanche of excess carriers. This avalanche multiplication of excess carriers causes a macroscopic current flow through the SPAD 2, resulting in a transient voltage drop across the resistor 3. In other words, an absorbed photon leads to a detectable signal in form of a voltage spike across the resistor 3. The power spectrum of the signal caused by photon absorption may have a broad power spectrum 26 as shown in FIG. 3. The power spectrum 26 decreases with increasing frequency. The bulk spectral weight of the photon signal is typically lower than the gate repetition frequency $f_{gate}$ for gate repetition frequencies equal to or above 1 GHz.

As the SPAD 2 has a finite capacitance, the gating signal $V_{gate}$ causes further voltage pulses across the resistor 3. When the gating signal $V_{gate}$ is in the form of a square wave, a positive voltage pulse is generated by the SPAD when reacting to the rise edge of the gating signal $V_{gate}$, followed by a negative voltage pulse when reacting to the falling edge of the gating signal $V_{gate}$. The amplitude of these spurious transients caused by the gating signal $V_{gate}$ can be larger than the amplitude of the signal caused by photon absorption. As a result, the spurious transients can obscure the photon absorption signal. The spurious transients typically have a power spectrum that is substantially different from the power spectrum 26 of the photon signal. When the gating signal $V_{gate}$ is in the form of a square wave, the power spectrum of the spurious transients consists of a set of narrow bands at the gate repetition frequency $f_{gate}$ and at higher harmonics thereof. With reference to FIG. 3, the power spectrum of the spurious transients may include significant components at the gate repetition frequency 27 and at a second 28 and a third 29 harmonics thereof, whereby the power decreases with higher frequency.

The SPAD signal is coupled through the capacitor 15 and the second transmission line 16 to the input port of the non-reflective filter circuit 17. The low-pass filter 18, included in the non-reflective filter circuit 17, passes frequency components of the input signal below the cut-off frequency $f_{LP}$ and strongly attenuates frequency components at frequencies above the cut-off frequency $f_{LP}$. The low-pass filter 18 may have a frequency dependent transmission 31 as illustrated in FIG. 4.

As the cut-off frequency $f_{LP}$ is lower than the gate repetition frequency $f_{gate}$, the low-pass filter 18 does not transmit or, at least, attenuates to a negligible level, frequency components of the spurious transients consisting of a set of narrow bands at the gate repetition frequency $f_{gate}$ and at higher harmonics thereof. Yet the cut-off frequency $f_{LP}$ is high enough to pass a large part of the broad power spectrum 26 of the signal caused by photon absorption. In other words, the low-pass filter 18 removes the frequency components of the spurious transients while passing a substantial part of the signal caused by photon absorption. In an example, the dashed line 30 in FIG. 3 indicates the cut-off frequency $f_{LP}$.

Figure 4:
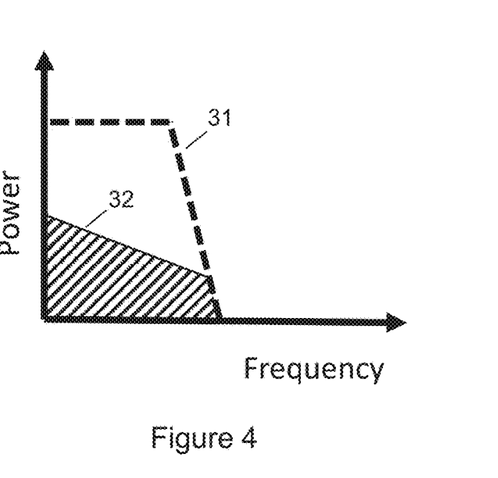
FIG. 4 is a schematic plot of power against frequency showing a power spectrum of the electrical signals generated by the SPAD after passing a low-pass filter.

FIG. 4 illustrates the power spectrum 32 of the signal caused by photon absorption after passing the low-pass filter 18. The low-pass filter 18 may be configured to pass more than 50%, 75% or 90% of the broad power spectrum 26 of the signal caused by photon absorption. Preferably, the cut-off frequency $f_{LP}$ matches or is close to the −3 dB avalanche bandwidth of the SPAD 2, that is the frequency above which the spectral power of the signal caused by photon absorption is less than half of its peak power.

As the non-reflective filter circuit 17 is impedance matched to the second transmission line 16, the energy of the SPAD signal that is not transmitted through the low-pass filter 18, i.e. mostly the spurious gate transients, is not reflected back to the SPAD 2. This is advantageous as the SPAD 2 is sensitive to such returning energy which can deter the performance of the photon detection system 1. For example, when the gating signal $V_{gate}$ is in the form of a square wave, a reflected gate transient can interfere at the SPAD 2 with a subsequent gating signal impairing an effective detection efficiency flatness within the gate duration.

After passing the non-reflective filter circuit 17, the filtered SPAD signal is passed to amplifier 19 and then discriminator 20 in order to determine the presence or absence of photon induced spikes in the SPAD signal. If the filtered SPAD signal exceeds the predetermined voltage level, the discriminator 20 converts the filtered SPAD signal into a logical high signal, for example a High-TTL pulse, which is outputted at detector output 21.

In an embodiment, the low pass filter 18 is used to filter the SPAD signal, because no precise matching of the cut-off frequency and the gate repetition frequency is required. This improves the manufacturability of the system as it eases the need for using advanced manufacturing tolerances, for performing factory calibration, and for performing maintenance. Further, the use of the low pass filter 18 enables the photon detection system 1 to work over a range of gate repetition frequencies without significantly degrading its performance. Tolerance to variations in the gate repetition frequency is particularly advantageous for applications in quantum communications, where the gate repetition frequency is often matched to other system components, for example photon sources or optical interferometers.

In an embodiment, the photon detection system 1 may not include amplifier 6. In this case, the AC input voltage received at the second terminal 5 may be of sufficient amplitude, such that no further amplification is necessary.

Figure 5:
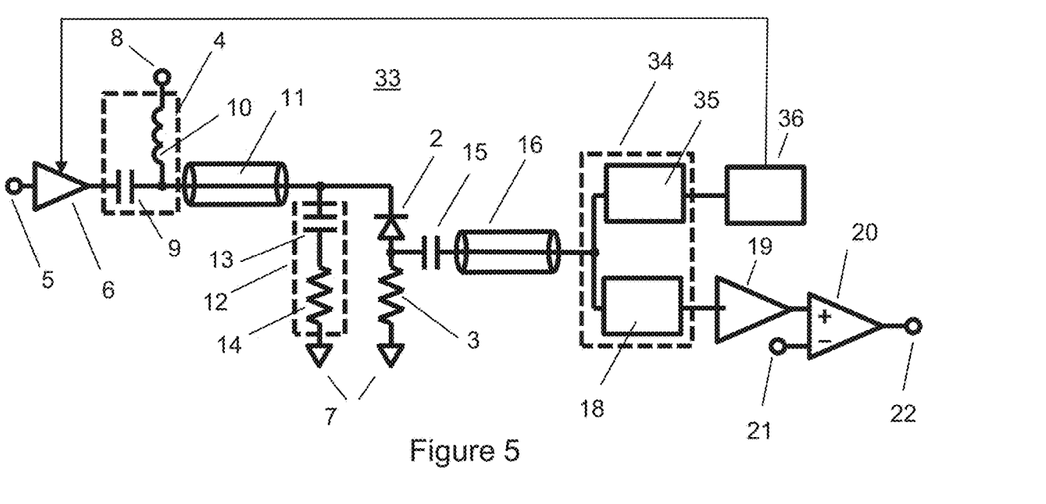
FIG. 5 is a schematic of a variation on the photon detection system of FIG. 1.

FIG. 5 shows a variation on the photon detection system of FIG. 1. To avoid unnecessary repetition, like reference numerals will be used to denote like features. The biasing of the SPAD 2 and the signal generated by the SPAD 2 are as described with reference to FIG. 1.

The SPAD signal is coupled through the capacitor 15 and the second transmission line 16 to the input port of the non-reflective filter circuit 34. The non-reflective filter circuit 34 includes the low-pass filter 18. The output of the low-pass filter 18 is passed to amplifier 19 and then discriminator 20 as described with reference to FIG. 1.

Figure 6:
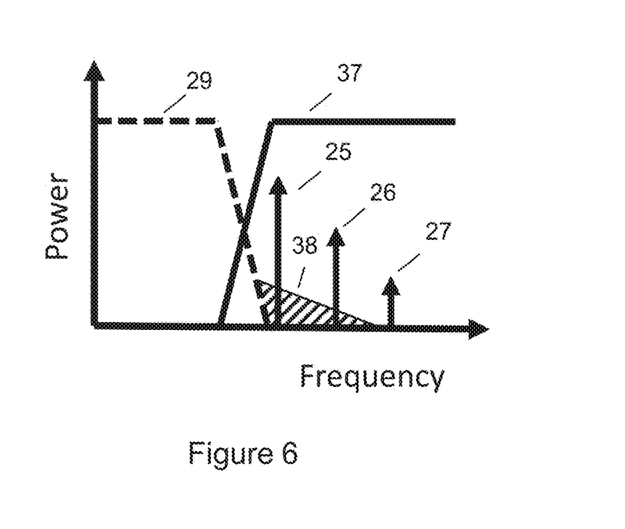
FIG. 6 is a schematic plot of power against frequency showing a power spectrum of the electrical signals generated by the SPAD after passing a high-pass filter.

The non-reflective filter circuit 34 of the photon detection system 33 further includes a high-pass filter 35. The high-pass filter 35 is characterised by a cut-off frequency $f_{HP}$. The cut-off frequency $f_{HP}$ is lower than the repetition frequency $f_{gate}$. Preferably, the cut-off frequency $f_{HP}$ and the cut-off frequency $f_{LP}$ are substantially the same. The high-pass filter 35 may have a frequency dependent transmission 37, as illustrated in FIG. 6. The non-reflective filter circuit 34 may be a diplexer. When the cut-off frequency $f_{HP}$ and the cut-off frequency $f_{LP}$ are substantially the same and the non-reflective filter circuit 34 is a diplexer, the cut-off frequencies $f_{LP}$ and $f_{HP}$ may be electrically tuneable.

An input port of the high-pass filter 35 and an input port of the low-pass filter 18 are both connected to the input port of the non-reflective filter circuit 34. An output of the high-pass filter 35 is connected to a power measuring device 36. The power measuring device 36 is configured to determine a power level at the output of the high-pass filter 35. The power measuring device 36 is further configured to have an input impedance so as to prevent reflections back to the high-pass filter 35 and/or the SPAD 2.

Like the non-reflective filter circuit 17 of the photon detection system 1 of FIG. 1, the non-reflective filter circuit 34 of the photon detection system 33 is impedance matched to the second transmission line 16 up to the frequency $f_{non\text{-}refl}$. In other words, the non-reflective filter circuit 34 is configured to prevent reflections back to the SPAD 2.

During operation of the photon detection system 34, the SPAD signal is coupled to the input port of the non-reflective filter circuit 34. The low-pass filter 18, included in the non-reflective filter circuit 34, passes frequency components of the input signal below the cut-off frequency $f_{LP}$ to amplifier 19 and then discriminator 20 as described with reference to FIG. 1. The high-pass filter 35, included in the non-reflective filter circuit 34, passes frequency components of the input signal above the cut-off frequency $f_{HP}$ to the power measuring device 36.

FIG. 6 illustrates the power spectrum 38 of the signal caused by photon absorption and the power spectrum of the spurious transients after passing the high-pass filter 35. As the cut-off frequency $f_{HP}$ is lower than the gate repetition frequency $f_{gate}$, the high-pass filter 35 passes the frequency components of the spurious transients consisting of a set of narrow bands at the gate repetition frequency $f_{gate}$ 27 and at higher harmonics thereof 28, 29. Yet the cut-off frequency $f_{HP}$ is high enough to block a large part of the broad power spectrum 26 of the signal caused by photon absorption. In other words, the high-pass filter 35 is configured such that the power level determined by the power measuring device 36 at the output of the high-pass filter 35 is caused predominantly by the spurious transients.

The power level determined by the power measuring device 36 may be used to monitor the power of the gating signal $V_{gate}$ during operation of the photon detection system 33. The measured power level may be further used as a feedback signal for maintaining a constant amplitude of the gating signal $V_{gate}$ despite, for example, temperature variations, vibrations or drifts due to component ageing. To this end a gain of the amplifier 6 used to amplify the received AC input voltage may be adjusted so as to perform an automatic gain (AGC) servo loop. In examples where temperature variations, vibrations and/or component ageing cause the power level determined by the power measuring device 36 to be lower than a predetermined threshold, the gain of the amplifier 6 used to amplify the received AC input voltage may be increased. In examples where temperature variations, vibrations and/or component ageing cause the power level determined by the power measuring device 36 to be higher than a predetermined threshold, the gain of the amplifier 6 used to amplify the received AC input voltage may be decreased.

It is advantageous to monitor and stabilise the amplitude of the gating signal V gate during operation of the photon detection system 33, as this improves the long term stability of the system in general, and in particular of the detection efficiency, dark count rate, afterpulsing and timing response.

It is further advantageous to use a diplexer as non-reflecting filter 34, as this reduces the complexity, cost and footprint requirements of the photon detection system 33.

Figure 7:
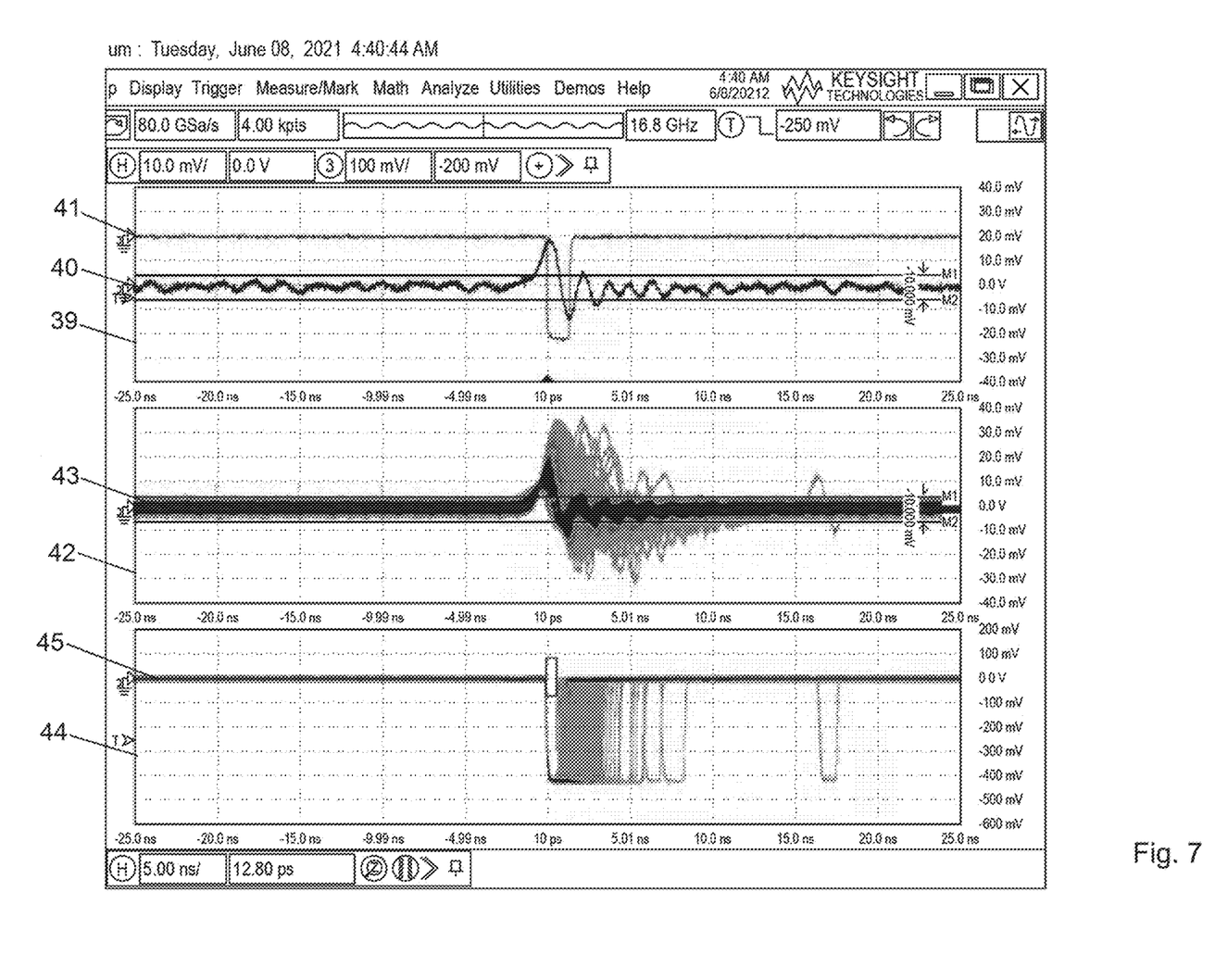
FIG. 7 is a set of plots of voltage against frequency for electrical signals outputted by the low-pass filter output and by the discriminator during operation the photon detection system of FIG. 5.
Figure 8:
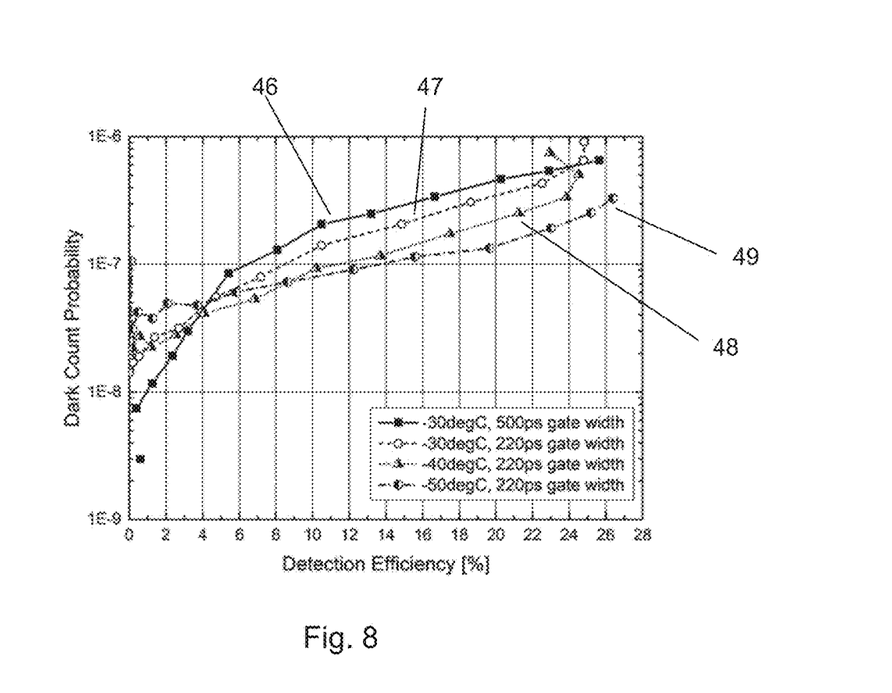
FIG. 8 is a plot of dark count probability against photon detection efficiency for the photon detection system of FIG. 5.

The experimental results shown in FIGS. 7 and 8 were obtained using the photon detection system 33 described in FIG. 5 with the following specifications: The gating signal V gate is in the form of a square wave. The gate repetition frequency f gate is 1 GHz. The non-reflective filter circuit 34 is a surface-mounted diplexer which comprises the low-pass filter 18 and the high-pass filter 35. The cut-off frequencies $f_{LP}$ and $f_{HP}$ are approximately 800 MHz.

The top panel 39 in FIG. 7 shows voltage against time for a signal 40 at the output of the low-pass filter 18 generated in response to the absorption of a photon by SPAD 2, and the corresponding output signal 41 of the discriminator 20. The middle panel 42 in FIG. 7 shows an accumulation 43 of repeated acquisitions of the signal 40 shown in the top panel 39. Correspondingly, the bottom panel 44 shows an accumulation 45 of the output signal 41 of the discriminator 20 corresponding to the repeated acquisitions.

FIG. 8 shows dark count probability against detection efficiency of the photon detection system 33. For data set 46, the duty cycle of the gating signal V gate is set to 50%, and the SPAD 2 is cooled to −30° C. For data sets 47, 48, and 49, the duty cycle of the gating signal $V_{gate}$ is set to 22%, and the SPAD 2 is cooled to −30° C., −40° C., and −50° C. respectively. The detection efficiency is varied by varying the DC bias $V_{bias}$.

In a variation on the photon detection system 33 of FIG. 5, the output of the high-pass filter is terminated into a power absorbing dummy load, instead of the power measuring device 36. The power absorbing dummy load prevents reflections back to high-pass filter 35 and/or the SPAD 2.

Figure 9:
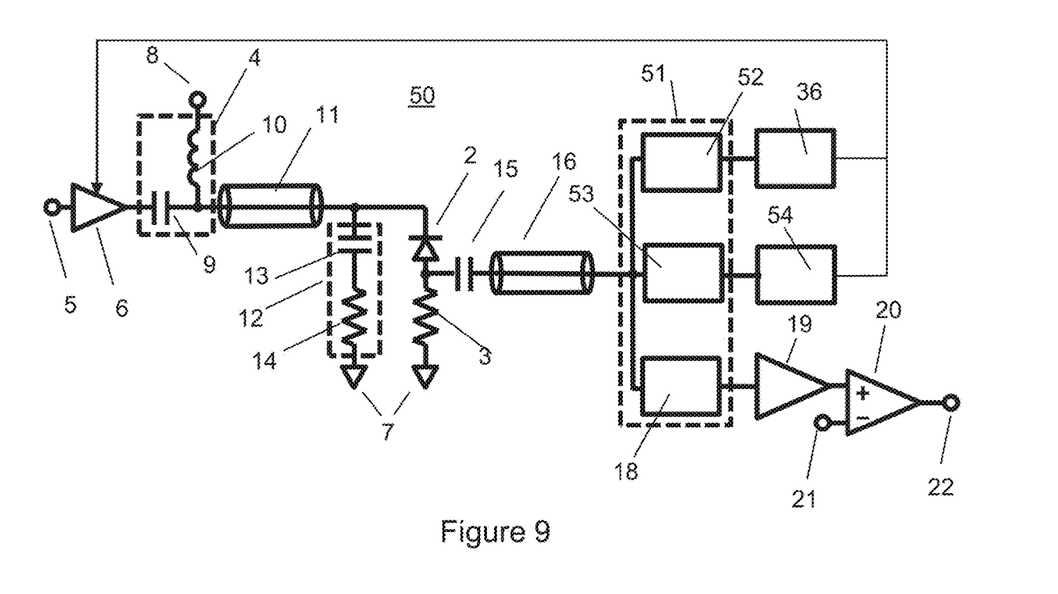
FIG. 9 is a schematic of a further variation on the photon detection system of FIG. 5.

FIG. 9 shows a further variation on the photon detection system of FIG. 5. The biasing of the SPAD 2 and the signal generated by the SPAD 2 are as described with reference to FIG. 1. The non-reflective filter circuit 51 includes the low-pass filter 18 and the high-pass filter 35. The output of the low-pass filter 18 is passed to amplifier 19 and then discriminator 20 as described with reference to FIG. 1. The output of the high-pass filter 52 is connected to the power measuring device 36.

The non-reflective filter circuit 51 further includes band-pass filter 53 characterised by a first and a second band frequency $f_{BP1}$ and $f_{BP2}$. An output of the band-pass filter 53 is connected to a second power measuring device 54. The band-pass filter 53 is configured to pass to the second power measuring device 54 frequency components which are above the first band frequency $f_{BP1}$ and below the second band frequency $f_{BP2}$. The first band frequency $f_{BP1}$ is lower than the gate repetition frequency $f_{gate}$. The second band frequency $f_{BP2}$ is higher than the first band frequency $f_{BP1}$ and lower than twice the gate repetition frequency $f_{gate}$. In other words, the band-pass filter 53 is configured to predominantly pass signals at the gate repetition frequency $f_{gate}$ while blocking second or higher harmonics of the gate repetition frequency $f_{gate}$. It is preferable that the cut-off frequency $f_{LP}$ and the first band frequency $f_{BP1}$ are substantially the same. It is further preferable that the cut-off frequency $f_{HP}$ and the second band frequency $f_{BP2}$ are substantially the same.

The second power measuring device 54 is configured to determine a power level at the output of the band-pass filter 53. The second power measuring device 54 is further configured to have an input impedance so as to prevent reflections back to the band-pass filter 53 and/or the SPAD 2.

Like the non-reflective filter circuit 17 of the photon detection system 1 of FIG. 1, the non-reflective filter circuit 51 of the photon detection system 50 is impedance matched to the second transmission line 16 up to the frequency $f_{non-refl}$. In other words, the non-reflective filter circuit 51 is configured to prevent reflections back to the SPAD 2.

During operation of the photon detection system 50, the SPAD signal is coupled to the input port of the non-reflective filter circuit 51. The low-pass filter 18, included in the non-reflective filter circuit 50, passes frequency components of the input signal below the cut-off frequency $f_{LP}$ to amplifier 19 and then discriminator 20 as described with reference to FIG. 1. The power level determined by the second power measuring device 54 is predominantly caused by the narrow spectral band of the spurious transients at the gate repetition frequency $f_{gate}$. The power level determined by the power measuring device 36 is predominantly caused by the set of narrow spectral bands of the spurious transients at higher harmonics of the gate repetition frequency $f_{gate}$.

The power levels determined by the power measuring device 36 and the second the power measuring device 54 may be used to monitor the power of the gating signal $V_{gate}$ during operation of the photon detection system 50. As described with reference to FIG. 5, the amplitude of the gating signal $V_{gate}$ may be stabilised based on the determined power levels despite, for example, temperature variations, vibrations or drifts due to component ageing.

The power levels determined by the power measuring device 36 and the second the power measuring device 54 may be further used to monitor and stabilise the form of the gating signal $V_{gate}$. For example, a change of the form of the gating signal $V_{gate}$ with respect to a predetermined form may be determined from a change of the power level determined by the power measuring device 36 relative to the power level determined by the second the power measuring device 54. When such a change of the form of the gating signal $V_{gate}$ is determined, a feedback signal may be provided to a gate waveform generator, generating the gating signal $V_{gate}$, such that the form of the gating signal $V_{gate}$ is restored and matches the predetermined form. The gate waveform generator may be a RF DAC (radio-frequency digital-to-analog converter).

In an embodiment, the form of the gating signal $V_{gate}$ is monitored and stabilised during operation of the photon detection system 50. This further improves the long term stability of the system in general, and in particular of the detection efficiency, dark count rate, afterpulsing and timing response.

In a variation on the photon detection system 50 of FIG. 9, the non-reflective filter circuit includes a plurality of band-pass filters instead of the band-pass filter 53. The plurality of band-pass filters are connected to a corresponding plurality of power measuring devices, such that each of the plurality of power measuring devices is configured to determine a power level at one of a plurality of narrow spectral bands corresponding to the set of narrow bands forming the power spectrum of the spurious transients.

Figure 10:
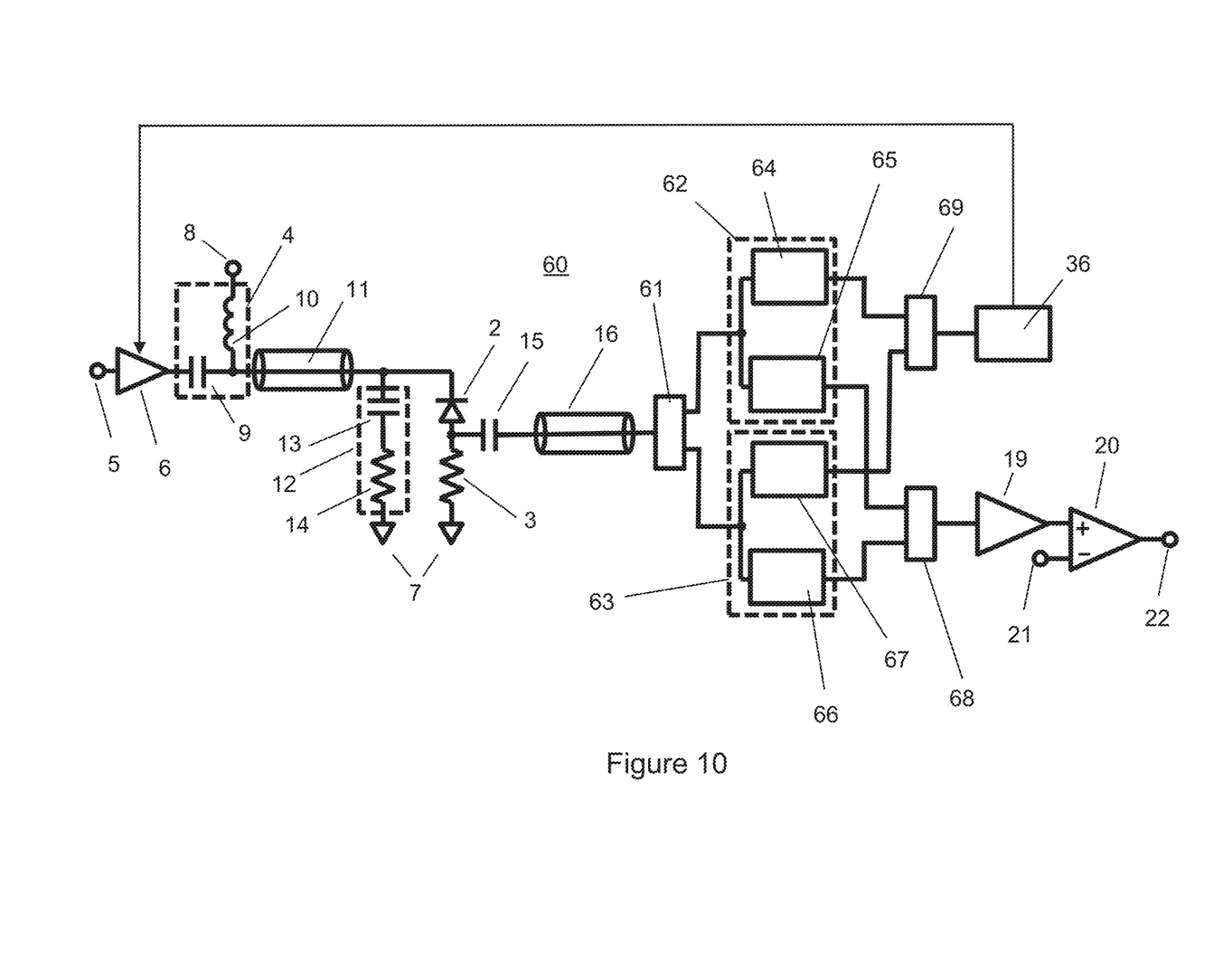
FIG. 10 is a schematic of yet a further variation on the photon detection system of FIG. 5.

FIG. 10 shows yet a further variation on the photon detection system of FIG. 5. The biasing of the SPAD 2 and the signal generated by the SPAD 2 are as described with reference to FIG. 1. The photon detection system 60 of FIG. 10 can be operated at a first gate repetition frequency $f_{gate,1}$ or at a second gate repetition frequency $f_{gate,2}$.

The SPAD signal is coupled through the capacitor 15 and the second transmission line 16 to an input of a first switch 61. The first switch 61 is configured to route an input signal to either a first or a second output port. The first output port of the first switch 61 is connected to an input port of a first non-reflective filter circuit 62, and the second output port of the first switch 61 is connected to an input port of a second non-reflective filter 63.

The first non-reflective filter circuit 62 includes a first low-pass filter 65 characterised by a cut-off frequency $f_{LP,1}$, and a first high-pass filter 64 characterised by a cut-off frequency $f_{HP,1}$. The cut-off frequency $f_{HP,1}$ and the cut-off frequency $f_{LP,1}$ are lower than the first gate repetition frequency $f_{gate,1}$. In an embodiment, the cut-off frequency $f_{HP,1}$ and the cut-off frequency $f_{LP,1}$ are substantially the same. The non-reflective filter circuit 62 may be a diplexer.

The second non-reflective filter circuit 63 includes a second low-pass filter 66 characterised by a cut-off frequency $f_{LP,2}$, and a second high-pass filter 67 characterised by a cut-off frequency $f_{HP,2}$. The cut-off frequency $f_{HP,2}$ and the cut-off frequency $f_{LP,2}$ are lower than the second gate repetition frequency $f_{gate,2}$. Preferably, the cut-off frequency $f_{HP,2}$ and the cut-off frequency $f_{LP,2}$ are substantially the same. The non-reflective filter circuit 63 may be a diplexer.

An output port of the first low-pass filter 65 and an output port of the second low-pass filter 66 are connected respectively to first and second input ports of a second switch 68. The second switch 68 is configured to route input signals at either the first or the second input port to an output port of the switch 68. The output of the second switch 68 is passed to amplifier 19 and then discriminator 20 as described with reference to FIG. 1.

An output port of the first high-pass filter 64 and an output port of the second high-pass filter 67 are connected respectively to first and second input ports of a third switch 69. The third switch 69 is configured to route input signals at either the first or the second input port to an output port of the switch 69. The output port of the third switch 69 is connected to the power measuring device 36.

Like the non-reflective filter circuit 17 of the photon detection system 1 of FIG. 1, the first and second non-reflective filter circuits 62, 63 of the photon detection system 60 are impedance matched so as to prevent reflections back to the SPAD 2.

When the photon detection system 60 is operated at the first gate repetition frequency $f_{gate,1}$, the first switch 61 is set to route input signals to the first output port and thereby to the input port of the first non-reflective filter circuit 62. In this case, the second switch 68 is configured to pass input signals at the first input port to amplifier 19 and then discriminator 20. Further, the third switch 69 is configured to pass input signals at the first input port to the power measuring device 36.

When the photon detection system 60 is operated at the second gate repetition frequency $f_{gate,2}$, the first switch 61 is set to route input signals to the second output port and thereby to the input port of the second non-reflective filter circuit 63. In this case, the second switch 68 is configured to pass input signals at the second input port to amplifier 19 and then discriminator 20. Further, the third switch 69 is configured to pass input signals at the second input port to the power measuring device 36.

The first gate repetition frequency $f_{gate,1}$ may be 1 GHz. The cut-off frequency $f_{HP,1}$ and the cut-off frequency $f_{LP,1}$ may be 800 MHz. The second gate repetition frequency $f_{gate,2}$ may be 1.5 GHz. The cut-off frequency $f_{HP,2}$ and the cut-off frequency $f_{LP,2}$ may be 1.2 GHz.

The first to third switches enable routing of the SPAD signal such that the photon detection system can be operated at two distinct gate repetition frequencies without deterring its performance. This is advantageous as it increases the flexibility and practical usefulness of the system, in particular for applications in the field of quantum cryptography.

In a variation on the photon detection system 60 of FIG. 10, the photon detection system includes a plurality of N non-reflective filter circuits and can be operated at any one of a plurality of N distinct gate repetition frequencies, where N is an integer larger than two. Based on a selected gate repetition frequency, selected from the plurality of N distinct gate repetition frequencies, the first switch is configured to select a signal path for the SPAD signal to one of the plurality of N non-reflective filter circuits. The second and third switches are configured to pass the outputs of the selected non-reflective filter circuit respectively to amplifier 19 (and then discriminator 20) and to the power measuring device 36.

Figure 11:
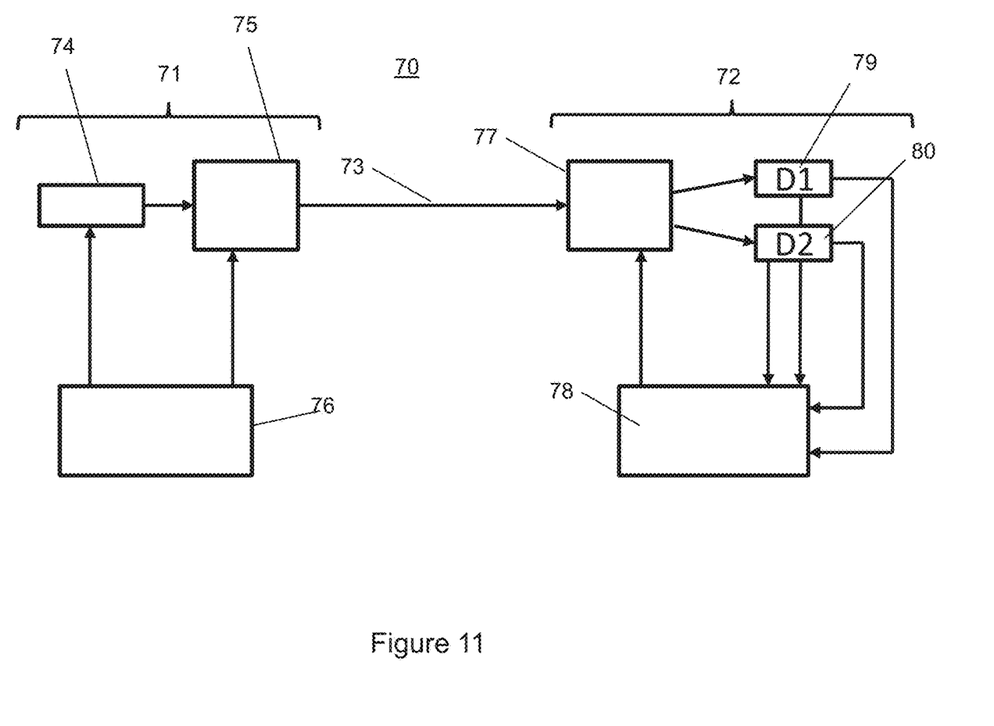
FIG. 11 is a schematic of a quantum communication system which uses a photon detection system according to the present invention.

FIG. 11 is a schematic of a quantum communication system 70 in accordance with an embodiment of the present invention. The quantum communication system 70 comprises a sender 71 which is referred to as Alice and a receiver, Bob 72. Alice 71 sends encoded pulses to Bob 72 along optical fibre 73. It should be noted, that although this is a simple system with one sender and one receiver, the same principles can be applied to quantum entangled systems and systems with multiple receivers or routers.

The sender in its simplest form comprises a source 74 which outputs photon pulses to an encoder 75. The encoder can encode the pulses in one of two or more bases. The basis used for sending the pulses is controlled by controller 76. The decoder 77 decodes the pulses by selecting a measurement basis under control 78. Once a measurement basis has been selected, the decoder will either direct the weak pulse to detector D1 79 or detector D2 80. If the measurement basis has been correctly selected by the decoder to match that of Alice's sending basis, then the result can be determined with a theoretical accuracy of 100%. If an incorrect basis has been used, then either detector could register a count with a 50% accuracy. Detector D1 and/or D2 is a photon detection system of the type described with reference to any of FIGS. 1 to 10.

Those skilled in the art will appreciate that various modifications may be made to the above described embodiment without departing from the scope of the present invention. For example, the photon detection system of FIG. 1, 5, 9, or 10 may further include a conventional gate cancellation circuit which receives as input the output of the low-pass filter and which output is passed to the amplifier 19. The conventional gate cancellation circuit may be based on a self-differencing technique.

Whilst certain embodiments have been described, these embodiments have been presented by way of example only, and are not intended to limit the scope of the inventions. Indeed, the novel devices, and methods described herein may be embodied in a variety of other forms; furthermore, various omissions, substitutions and changes in the form of the devices, methods and products described herein may be made without departing from the spirit of the inventions. The accompanying claims and their equivalents are intended to cover such forms or modifications as would fall within the scope and spirit of the inventions.

The invention claimed is:

1. A photon detection system, comprising:
an avalanche photodiode configured to generate a photodiode signal in response to an incident photon;
a biasing circuit configured to supply a gating signal to the avalanche photodiode, wherein the gating signal is a periodic signal configured to reverse bias the avalanche photodiode above and below a breakdown voltage for photon detection of the avalanche photodiode during each period;
a transmission line configured to receive the photodiode signal and to provide the photodiode signal to a non-reflective filter circuit, and
the non-reflective filter circuit configured to:
receive, at an input port, the photodiode signal from the transmission line, and
provide, at a first output port, a first filtered output signal by applying a low-pass filter with a first cut-off frequency to the received photodiode signal,
wherein the input port of the non-reflective filter circuit is configured to be impedance matched to the transmission line up to a frequency higher than a gate frequency of the gating signal.

2. The photon detection system of claim 1, wherein the gate frequency is higher than the first cut-off frequency.

3. The photon detection system of claim 1, wherein the non-reflective filter circuit is further configured to provide, at a second output port, a second filtered output signal by applying a high-pass filter with a second cut-off frequency to the received photodiode signal.

4. The photon detection system of claim 3, wherein the first cut-off frequency and second cut-off frequency are substantially the same.

5. The photon detection system of claim 3, further comprising a power measuring circuit configured to determine a signal power based on the second filtered output signal.

6. The photon detection system of claim 5, wherein the biasing circuit is further configured to receive a feedback signal generated based on the determined signal power, and to adjust, based on the feedback signal, the gating signal to match a target gating signal.

7. The photon detection system of claim 1, wherein the non-reflective filter circuit is a diplexer.

8. The photon detection system of claim 1, further comprising a discriminator circuit configured to output an electrical pulse based on the first filtered output signal.

9. The photon detection system of claim 1, wherein the gating signal is in the form of square wave or a sinusoid.

10. The photon detection system of claim 1, wherein the frequency is greater than 1 GHz.

11. The photon detection system of claim 1, wherein the avalanche photodiode is an InGaAs/InP single-photon avalanche photodiode.

12. A quantum communication system, comprising:
a sender configured to send light pulses encoded using a basis selected from at least two bases, and
a receiver comprising the photon detection system according to claim 1.

13. A method of detecting a photon using an avalanche photodiode, the method comprising:
supplying a gating signal to the avalanche photodiode, wherein the gating signal is a periodic signal configured to reverse bias the avalanche photodiode above and below its breakdown voltage for photon detection during each period;
providing, to a transmission line, a photodiode signal generated by the avalanche photodiode in response to an incident photon;
providing the photodiode signal from the transmission line to an input port of a non-reflective filter circuit; and
providing, at a first output port of the non-reflective filter circuit, a first filtered output signal by applying a low-pass filter with a first cut-off frequency to the provided photodiode signal,
wherein the input port of the non-reflective filter circuit is configured to be impedance matched to the transmission line up to a frequency higher than a gate frequency of the gating signal.

14. The method of claim 13, wherein the gating signal has a gate frequency which is higher than the first cut-off frequency.

15. The method of claim 13, further comprising:
providing, at a second output port of the non-reflective filter circuit, a second filtered output signal by applying a high-pass filter with a second cut-off frequency to the received photodiode signal.

16. The method of claim 15, wherein the first cut-off frequency and second cut-off frequency are substantially the same.

17. The method of claim 15, further comprising:
determining, by a power measuring circuit, a signal power based on the second filtered output signal.

18. The method of claim 17, further comprising:
receiving a feedback signal generated based on the determined signal power, and
adjusting, based on the feedback signal, the gating signal to match a target gating signal.

19. The method of claim 13, wherein the non-reflective filter circuit is a diplexer.

20. The method of claim 13, further comprising:
determining the presence or absence of photon induced spikes in the first filtered output signal, and
in response to determining the presence of photon induced spikes in the first filtered output signal, generating as an output an electrical signal.

* * * * *